US009620706B2

(12) United States Patent
Lee et al.

(10) Patent No.: US 9,620,706 B2
(45) Date of Patent: Apr. 11, 2017

(54) MAGNETIC ETCH STOP LAYER FOR SPIN-TRANSFER TORQUE MAGNETORESISTIVE RANDOM ACCESS MEMORY MAGNETIC TUNNEL JUNCTION DEVICE

(71) Applicant: QUALCOMM Incorporated, San Diego, CA (US)

(72) Inventors: Kangho Lee, San Diego, CA (US); Chando Park, San Diego, CA (US); Jimmy Kan, San Diego, CA (US); Matthias Georg Gottwald, Leuven (BE); Xiaochun Zhu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/558,103

(22) Filed: Dec. 2, 2014

(65) Prior Publication Data

US 2016/0155931 A1    Jun. 2, 2016

(51) Int. Cl.
| | | |
|---|---|---|
| H01L 29/82 | (2006.01) | |
| H01L 21/02 | (2006.01) | |
| H01L 21/00 | (2006.01) | |
| H01L 43/08 | (2006.01) | |
| H01L 43/12 | (2006.01) | |

(52) U.S. Cl.
CPC ............ *H01L 43/08* (2013.01); *H01L 43/12* (2013.01)

(58) Field of Classification Search
CPC .......... H01L 43/02; H01L 43/08; H01L 43/12

USPC .. 257/421, 422, 295, 401, E21.09, E43.004; 365/158; 438/3, 270, 283; 428/846.2-4
See application file for complete search history.

(56) References Cited

U.S. PATENT DOCUMENTS

| | | | |
|---|---|---|---|
| 7,289,305 B2 | 10/2007 | Fuke et al. | |
| 8,456,893 B2 | 6/2013 | Horng et al. | |
| 8,553,370 B2 | 10/2013 | Hong et al. | |
| 8,565,013 B2 | 10/2013 | Bessho et al. | |
| 8,611,055 B1* | 12/2013 | Pakala | G11B 5/3163 360/324.2 |
| 2004/0043526 A1 | 3/2004 | Ying et al. | |
| 2008/0273375 A1 | 11/2008 | Dahmani et al. | |
| 2008/0293165 A1* | 11/2008 | Ranjan | B82Y 10/00 438/3 |
| 2008/0316657 A1* | 12/2008 | Zhang | B82Y 10/00 360/324.11 |
| 2009/0174968 A1 | 7/2009 | Singleton et al. | |
| 2009/0219754 A1* | 9/2009 | Fukumoto | B82Y 25/00 365/158 |
| 2010/0009647 A1* | 1/2010 | Taira | H04B 1/26 455/255 |

(Continued)

OTHER PUBLICATIONS

International Search Report and Written Opinion for International Application No. PCT/US2015/059154, ISA/EPO, Date of Mailing Feb. 23, 2016, 11 pages.

*Primary Examiner* — Dzung Tran
(74) *Attorney, Agent, or Firm* — Toler Law Group, PC

(57) ABSTRACT

An apparatus includes a capping layer disposed on top of a free layer. The apparatus also includes a magnetic etch stop layer disposed on top of the capping layer. The capping layer and the magnetic etch stop layer are included in a spin-transfer torque magnetoresistive random access memory (STT-MRAM) magnetic tunnel junction (MTJ) device.

30 Claims, 9 Drawing Sheets

(56) References Cited

U.S. PATENT DOCUMENTS

| | | |
|---|---|---|
| 2010/0065935 A1 | 3/2010 | Horng et al. |
| 2010/0096716 A1* | 4/2010 | Ranjan ................. B82Y 10/00 257/421 |
| 2011/0014500 A1* | 1/2011 | Horng ................. C23C 14/3414 428/846.3 |
| 2011/0149647 A1* | 6/2011 | Kim ....................... G11C 11/16 365/171 |
| 2011/0163400 A1* | 7/2011 | Ono ....................... B82Y 25/00 257/421 |
| 2012/0155156 A1 | 6/2012 | Watts et al. |
| 2013/0221460 A1 | 8/2013 | Jan et al. |

\* cited by examiner

MAGNETIC ETCH STOP LAYER FOR SPIN-TRANSFER TORQUE MAGNETORESISTIVE RANDOM ACCESS MEMORY MAGNETIC TUNNEL JUNCTION DEVICE

I. FIELD

The present disclosure is generally related to a magnetic etch stop layer for a spin-transfer torque magnetoresistive random access memory (STT-MRAM) magnetic tunnel junction (MTJ) device.

II. DESCRIPTION OF RELATED ART

Advances in technology have resulted in smaller and more powerful computing devices. For example, there currently exist a variety of portable personal computing devices, including wireless telephones such as mobile and smart phones, tablets, and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Wireless telephones may include spin-transfer torque magnetoresistive random access memory (STT-MRAM) devices to store data. STT-MRAM devices may be implemented using a magnetic tunnel junction (MTJ) device to store data. For example, an MTJ device may include a free layer (e.g., a storage layer) having a magnetic moment representative of a data value. During fabrication, magnetic properties of the free layer may be damaged during etching of adjacent layers (e.g., during etching of a capping layer). Sacrificial etch stop layers (or buffer layers) may be deposited on top of the capping layer to protect the free layer during etching to reduce degradation; however, significant degradation may occur regardless of the deposition of the sacrificial etch stop layers.

III. SUMMARY

Techniques for protecting a free layer of a spin-transfer torque magnetoresistive random access memory (STT-MRAM) magnetic tunnel junction (MTJ) device are shown. The MTJ device may include pinned layers, a tunneling barrier layer, the free layer, a capping layer, a magnetic etch stop layer, and a top electrode. In a particular embodiment, the MTJ device may be a perpendicular MTJ device. For example, the magnetic moment of the free layer and the magnetic moment of one or more layers in the pinned layers may be perpendicular to the plane of the free layer.

The capping layer above the free layer may be comprised of Magnesium Oxide (MgO), Aluminum Oxide (AlOx), Hafnium Oxide (HfOx), or Tantalum Oxide (TaOx) and the magnetic etch stop layer may be comprised of Cobalt Iron Boron (CoFeB), Cobalt Iron (CoFe), Iron Boron (FeB), Cobalt Iron (CoFe), Nickel Iron Boron (NiFeB), Nickel Iron Silicon Boron (NiFeSiB), or Nickel Iron (NiFe). The magnetic etch stop layer may be deposited on top of the capping layer to protect both layers during etching. For example, a hard mask may be placed on the top electrode (located on top of the magnetic etch stop layer), and the MTJ device may undergo an etching process. During the etching process, the magnetic etch stop layer (in addition to the capping layer) may protect magnetic properties of the free layer. For example, the magnetic etch stop layer may stabilize the perpendicular magnetic anisotropy of the free layer during high annealing temperatures associated with an etching process (e.g., a reactive ion etching process). In a first embodiment, the magnetic etch stop layer may be sufficiently thin (e.g., approximately 5 Angstroms thick or less) to be substantially magnetically inert (i.e., "magnetically dead"). In a second embodiment, the magnetic etch stop layer may be thicker (e.g., approximately between 10 Angstroms and 30 Angstroms) to exhibit a magnetic moment.

In a particular embodiment, an apparatus includes a capping layer disposed on top of a free layer. The apparatus also includes a magnetic etch stop layer disposed on top of the capping layer. The capping layer and the magnetic etch stop layer are included in a spin-transfer torque magnetoresistive random access memory (STT-MRAM) magnetic tunnel junction (MTJ) device.

In another particular embodiment, a method of forming a spin-transfer torque magnetoresistive random access memory (STT-MRAM) magnetic tunnel junction (MTJ) device includes depositing a capping layer on top of a free layer. The method also includes depositing a magnetic etch stop layer on top of the capping layer.

In another particular embodiment, an apparatus includes first means for protecting a free layer disposed on top of the free layer. The apparatus also includes second means for protecting the free layer. The second means is disposed on top of the first means. The first means and the second means are included in a spin-transfer torque magnetoresistive random access memory (STT-MRAM) magnetic tunnel junction (MTJ) device.

Particular advantages provided by at least one of the disclosed embodiments include an ability to protect a free layer of a spin-transfer torque magnetoresistive random access memory (STT-MRAM) magnetic tunnel junction (MTJ) device during etching. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 4:
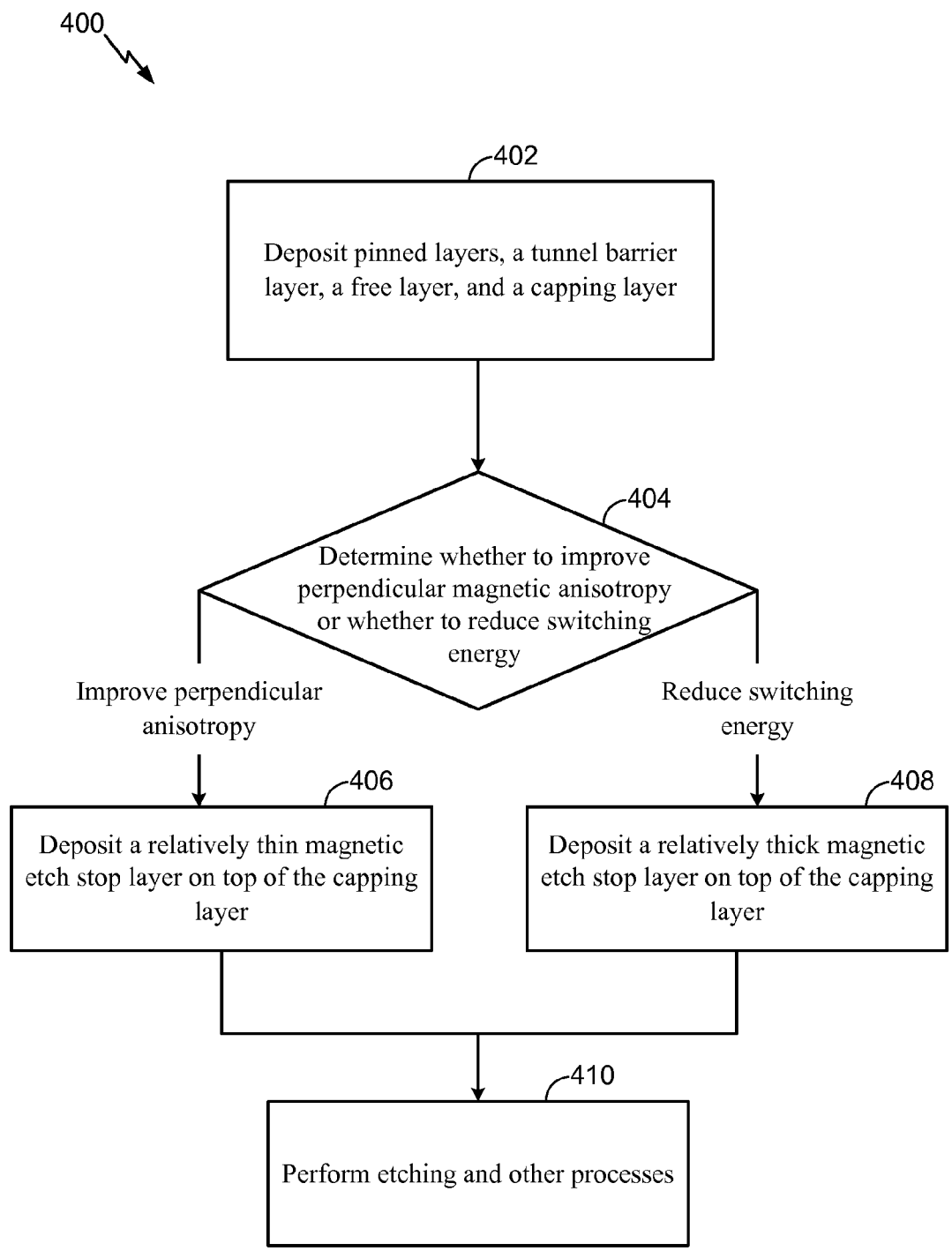
Figure 5:
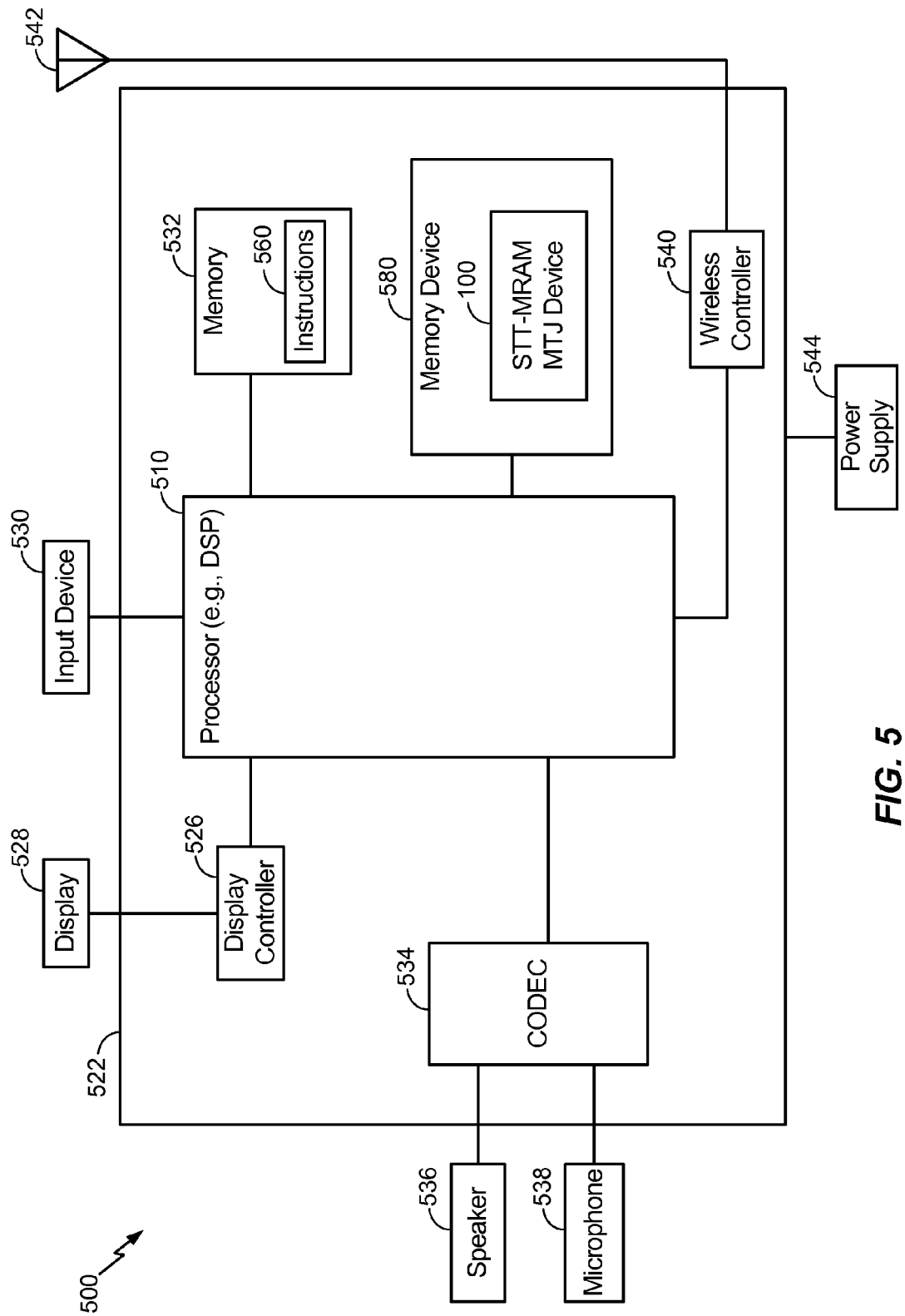
Figure 6:
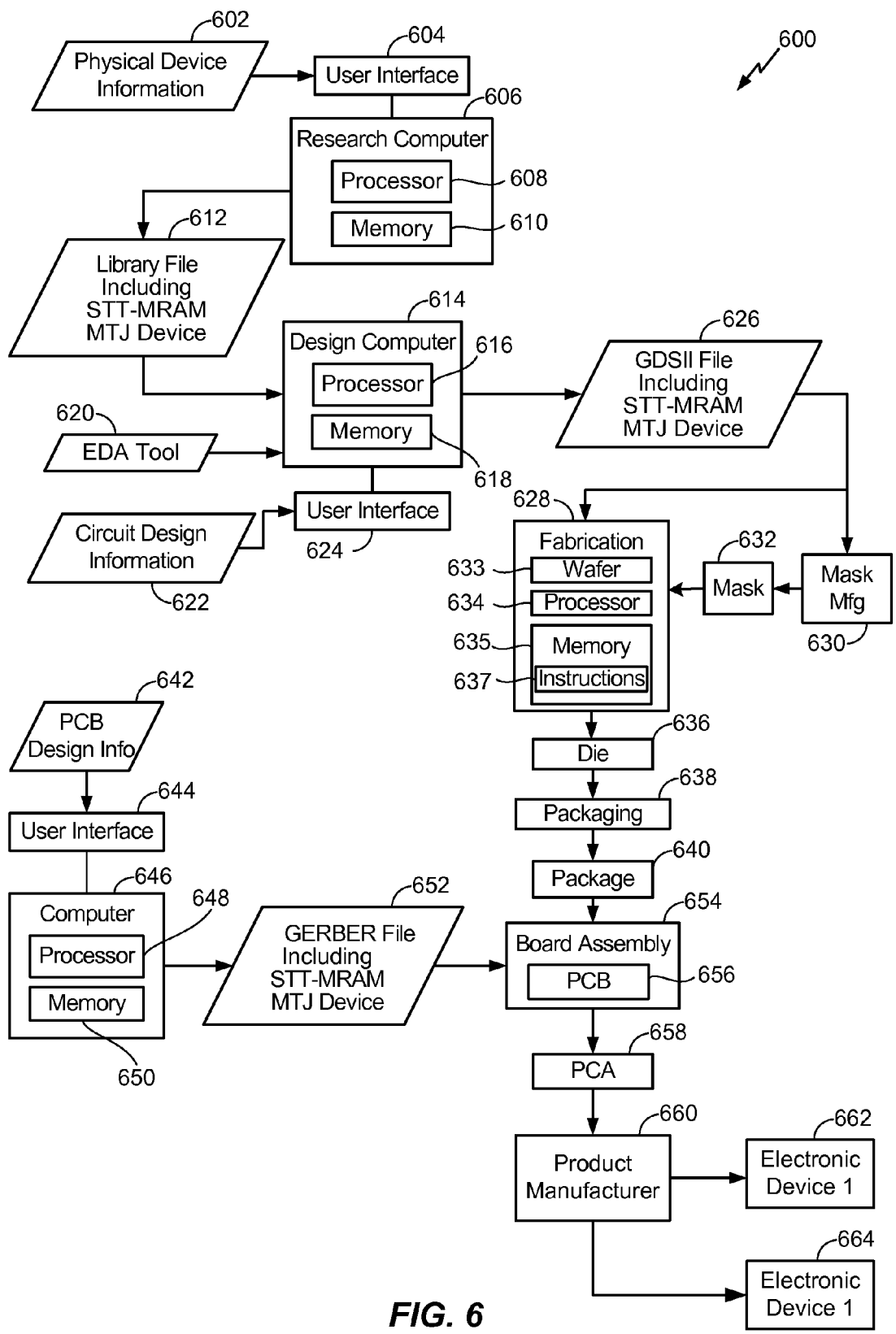

FIG. 4 depicts a flowchart to illustrate another particular embodiment of a method of forming a STT-MRAM MTJ device with a magnetic etch stop layer to reduce degradation of a free layer FIG. 5 is a block diagram of a wireless device that includes a STT-MRAM MTJ device with a magnetic etch stop layer; and FIG. 6 is a data flow diagram of a particular illustrative embodiment of a manufacturing process to manufacture electronic devices that include a STT-MRAM MTJ device with a magnetic etch stop layer that reduces degradation of a free layer.

V. DETAILED DESCRIPTION

Figure 1:
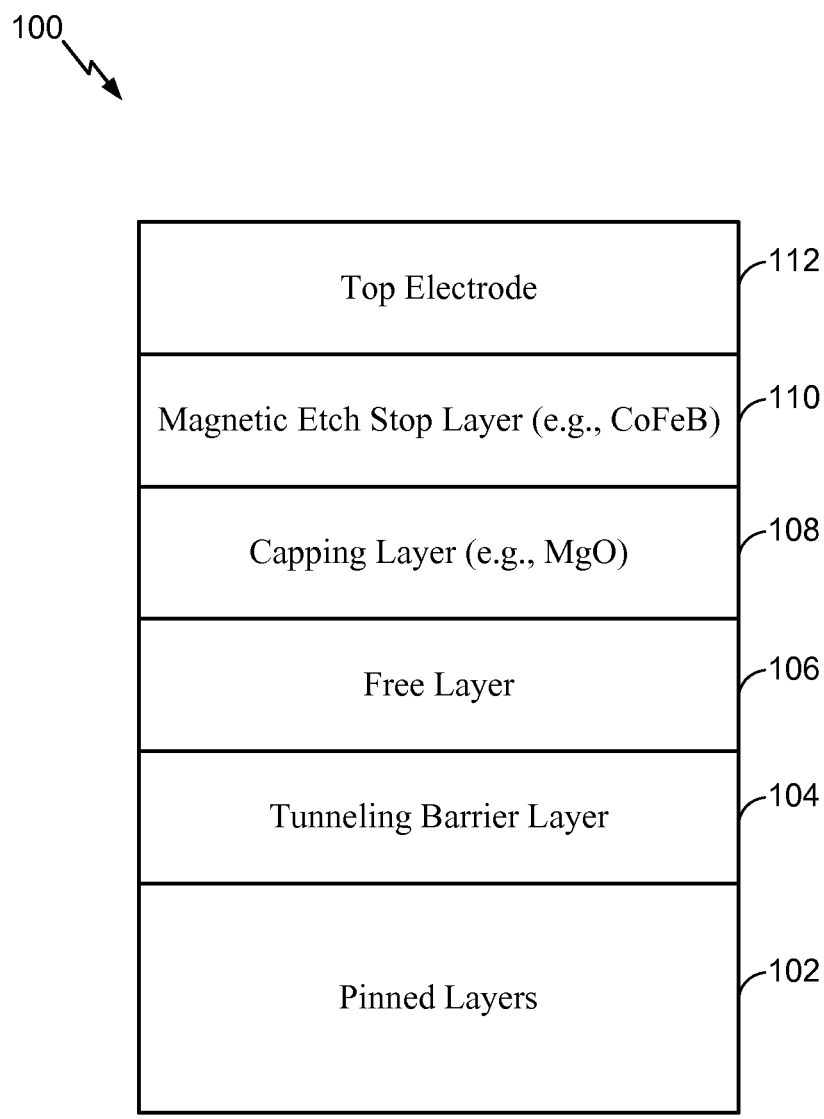
FIG. 1 is a diagram to illustrate a particular embodiment of a spin-transfer torque magnetoresistive random access memory (STT-MRAM) magnetic tunnel junction (MTJ) device with a magnetic etch stop layer to reduce degradation of a free layer.

Referring to FIG. 1, a particular embodiment of a spin-transfer torque magnetoresistive random access memory (STT-MRAM) magnetic tunnel junction (MTJ) device 100 with a magnetic etch stop layer formed to reduce degradation of a free layer is shown.

The STT-MRAM MTJ device 100 includes one or more pinned layers 102, a tunneling barrier layer 104, a free layer 106, a capping layer 108, a magnetic etch stop layer 110, and a top electrode 112. In a particular embodiment, the STT-MRAM MTJ device 100 may be a perpendicular MTJ device. For example, the magnetic moment of the free layer 106 and the magnetic moment of at least one of the pinned layers 102 may be perpendicular to the plane of the free layer 106.

The one or more pinned layers 102 may include a reference layer (e.g., a fixed layer) and a pinned layer that have magnetic domains oriented in the same direction. A magnetic domain of the free layer 106 may be programmable via a write current to indicate a state of the STT-MRAM MTJ device 100. For example, if the magnetization of the free layer 106 and the magnetization of the reference layer have the same orientation, the STT-MRAM MTJ device 100 may represent a data value having a first logical state (e.g., a logical "0"). Alternatively, if the magnetic domain of the free layer 106 and the magnetic domain of the reference layer have opposite orientations, the STT-MRAM MTJ device 100 may represent a data value having a second logical state (e.g., a logical "1"). In a particular embodiment, the one or more pinned layers 102 may be deposited on top of a bottom electrode (not shown).

In other embodiments, the one or more pinned layers 102 may also include one or more seed layers, one or more buffer layers, one or more stray field balance layers, one or more connection layers, one or more performance enhancement layers (e.g., synthetic pinned layers), or any combination thereof.

The tunneling barrier layer 104 may be deposited between the pinned layers 102 and the free layer 106. The tunneling barrier layer 104 may be an insulating barrier layer having a thickness that enables electrons to tunnel between the free layer 106 and the pinned layers 102 if a bias voltage is applied across the free layer 106 and the pinned layers 102. The tunneling barrier layer 104 may be comprised of Magnesium Oxide (MgO). In alternative embodiments, the tunneling barrier layer 104 may be comprised of Aluminum Oxide ($Al_2O_3$), Zirconium Dioxide ($ZrO_2$), Zirconium Aluminum Oxide ($ZrAlO_x$), Aluminum Nitride (AlN), Aluminum Oxynitride ($AlON_x$), Gallium Oxide ($Ga_2O_3$), or Europium Sulfide (EuS).

The free layer 106 may be a ferromagnetic layer that carries a magnetic moment having a changeable orientation. For example, the magnetic moment (e.g., the magnetic domain) of the free layer 106 may be programmable via a write current (e.g., a switching current). A direction of the magnetic moment of the free layer 106 relative to a direction of a fixed magnetic moment carried by the reference layer in the pinned layers 102 determines a data value represented by the STT-MRAM MTJ device 100, as explained above. Thus, if the STT-MRAM MTJ device 100 is a perpendicular MTJ device, the free layer 106 may have a perpendicular magnetic anisotropy. That is, the data value of the STT-MRAM MTJ device 100 is "directionally dependent" on the orientation of the magnetic moment of the free layer 106. The free layer 106 may be comprised of Cobalt Iron Boron (CoFeB), Cobalt Nickel (CoNi), or other alloys of materials such as CoFeB—Ta, Co/Pt, etc., and may have a thickness between approximately 10 Angstroms and 30 Angstroms. In another particular embodiment, the free layer 106 may be a multi-layer stack of CoFeB/Ta/CoFeB or CoFeB/Co/Ni, etc.

The capping layer 108 may be deposited on top of the free layer 106. The capping layer 108 may be comprised of Magnesium Oxide (MgO). The capping layer 108 may be configured to protect the free layer 106 during etching. For example, a hard mask (not shown) may be placed on the top electrode 112 and the STT-MRAM MTJ device 100 may undergo an etching process such that the length of each layer 102-112 is etched to be approximately equal to the length of the hard mask. During the etching process, the capping layer 108 may protect magnetic properties of the free layer 106. For example, the capping layer 108 may stabilize (or increase) the perpendicular magnetic anisotropy of the free layer 106 during high annealing temperatures associated with an etching process (e.g., a reactive ion etching process). Although the capping layer 108 is depicted as being comprised of Magnesium Oxide (MgO), in other embodiments, the capping layer 108 may be comprised of Aluminum Oxide ($Al_2O_3$) or Hafnium oxide (or other oxide materials such as oxidized CoFeB, Fe, Ta, etc.).

The magnetic etch stop layer 110 may be deposited on top of the capping layer 108. The magnetic etch stop layer 110 may be comprised of Cobalt Iron Boron (CoFeB). The magnetic etch stop layer 110 may also be configured to protect the free layer 106 during etching. For example, when the STT-MRAM MTJ device 100 undergoes the etching process, the magnetic etch stop layer 110 may provide an additional layer of protection along with the capping layer 108 to protect the magnetic properties of the free layer 106. For example, the magnetic etch stop layer 110 may stabilize the perpendicular magnetic anisotropy of the free layer 106, oxygen distribution, and inter-diffusion during high annealing temperatures associated with an etching process. Although the magnetic etch stop layer 110 is depicted as being comprised of Cobalt Iron Boron (CoFeB), in other embodiments, the magnetic etch stop layer 110 may be comprised of Iron (Fe), Cobalt (Co), Nickel (Ni), Iron Boron (FeB), an alloy thereof, any combination thereof.

In a first embodiment, the magnetic etch stop layer 110 may be sufficiently thin as to operate as a "magnetically dead" layer. For example, a thickness of the magnetic etch stop layer 110 may cause the magnetic etch stop layer 110 to be substantially magnetically inert. As a non-limiting illustrative example, the thickness of the magnetic etch stop layer 110 may be approximately 5 Angstroms or less such that the magnetic etch stop layer 110 is substantially magnetically inert. When the magnetic etch stop layer 110 is magnetically inert, the magnetic contribution of the magnetic etch stop layer 110 to the STT-MRAM MTJ device 100 may be significantly reduced (or may be non-existent). For example, using a "thin" Cobalt Iron Boron (CoFeB) layer on top of a Magnesium Oxide (MgO) capping layer may enhance performance of the STT-MRAM MTJ device 100 by aiding in the formation of high perpendicular magnetic anisotropy in the free layer while protecting the free layer 106 during reactive ion etching (e.g., reducing atomic inter-diffusion processes).

In a second embodiment, the thickness of the magnetic etch stop layer 110 may cause the magnetic etch stop layer 110 to introduce in-plane anisotropy (e.g., exhibit magnetic moments) to the STT-MRAM MTJ device 100. As a non-limiting example, the thickness of the magnetic etch stop layer 110 may be between approximately 10 Angstroms and 30 Angstroms. The in-plane anisotropy (as opposed to a perpendicular anisotropy having a magnetic moment oriented out of the plane (e.g., vertically) of the STT-MRAM MTJ device 100) may reduce the switching current density (or energy) needed to operate the STT-MRAM MTJ device 100 without degrading tunnel magneto-resistance (TMR) and thermal barrier of the STT-MRAM MTJ device 100. For example, the magnetic etch stop layer 110 may be "weakly" coupled to the free layer 106 by ferromagnetic coupling. The free layer 106 may have a perpendicular anisotropy (e.g., a magnetic moment oriented in a vertical direction) and the magnetic etch stop layer 110 may have the in-plane anisotropy (e.g., a magnetic moment oriented in a horizontal direction). Due to the in-plane anisotropy, spin polarized electrons may be more effective at inducing a torque of the free layer 106, which may reduce the amount of switching current needed to change the orientation of the magnetic moment in the free layer 106. Reducing the amount of switching current needed to change the orientation of the magnetic moment may reduce an amount of energy needed to program the STT-MRAM MTJ device 100.

The top electrode 112 may be deposited on top of the magnetic etch stop layer 110. A write current (e.g., the switching current) or a read current may be provided to the STT-MRAM MTJ device 100 via the top electrode 112. For example, the top electrode 112 may function as an interface to program a data value to the STT-MRAM MTJ device 100 or to read a data value from the STT-MRAM MTJ device 100.

The STT-MRAM MTJ device 100 of FIG. 1 may provide etch-stop protection to the free layer 106 during an MTJ etching process. For example, the magnetic etch stop layer 110 may function as an etch-stop protection layer to the free layer 106 to stabilize the perpendicular magnetic anisotropy of the free layer 106 during high annealing temperatures associated with the etching process. To illustrate, the magnetic etch stop layer 110 may protect the magnetic properties of the free layer 106 during the etching process based on the chemical composition of the magnetic etch stop layer 110 and the capping layer 108 (e.g., a Cobalt Iron Boron (CoFeB) layer on top of Magnesium Oxide (MgO) capping) when the magnetic etch stop layer 110 is approximately 5 Angstroms thick or less. The magnetic etch stop layer 110 may also reduce the switching current of the STT-MRAM MTJ device 100 without degrading TMR and/or the thermal barrier when the magnetic etch stop layer 110 has a thickness between 10 Angstroms and 30 Angstroms.

Figure 2A:
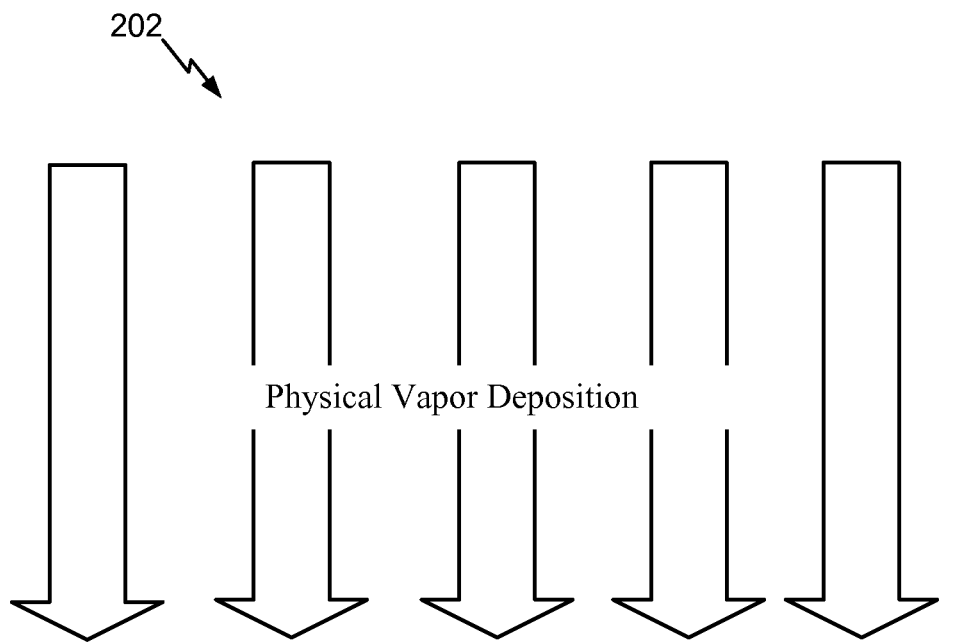
FIG. 2A is a diagram illustrating a particular stage of forming the STT-MRAM MTJ device of FIG. 1.
Figure 2A:
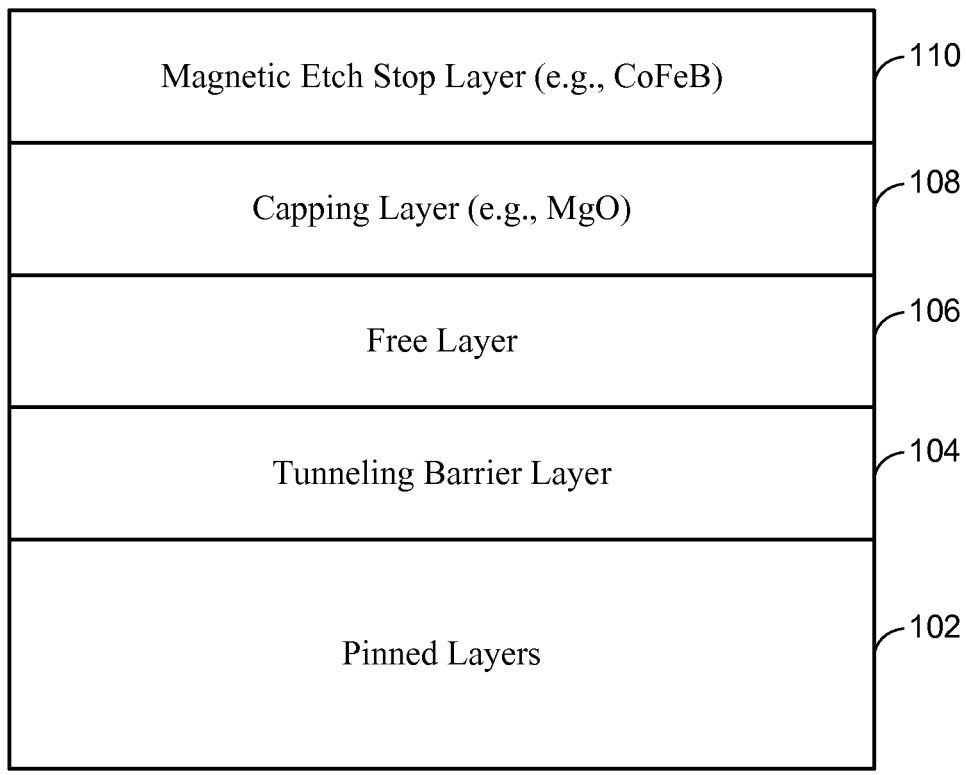

Referring to FIG. 2A, a particular stage 202 of forming the STT-MRAM MTJ device 100 of FIG. 1 is shown. The pinned layers 102, the tunneling barrier layer 104, the free layer 106, and the capping layer 108 may be formed within a chamber using physical vapor deposition (PVD) sputtering techniques. According to the stage 202 of FIG. 2A, the magnetic etch stop layer 110 is deposited on top of the capping layer 108 in the chamber using PVD sputtering techniques.

Figure 2B:
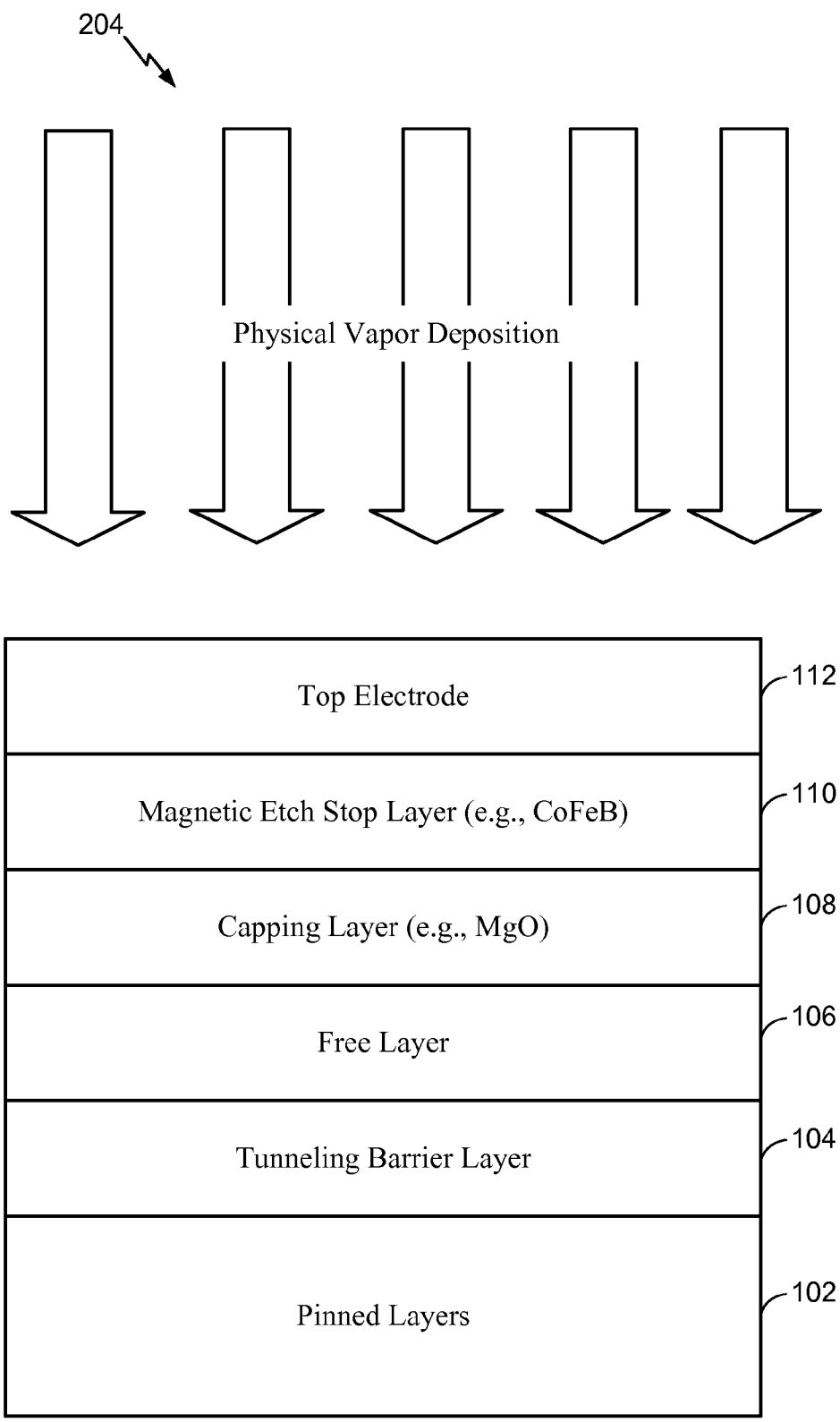
FIG. 2B is a diagram illustrating another particular stage of forming the STT-MRAM MTJ device of FIG. 1.

Referring to FIG. 2B, another particular stage 204 of forming the STT-MRAM MTJ device 100 of FIG. 1 is shown. According to the stage 204 of FIG. 2B, the top electrode 112 is deposited on top of the magnetic etch stop layer 110 in the chamber using PVD sputtering techniques.

Figure 2C:
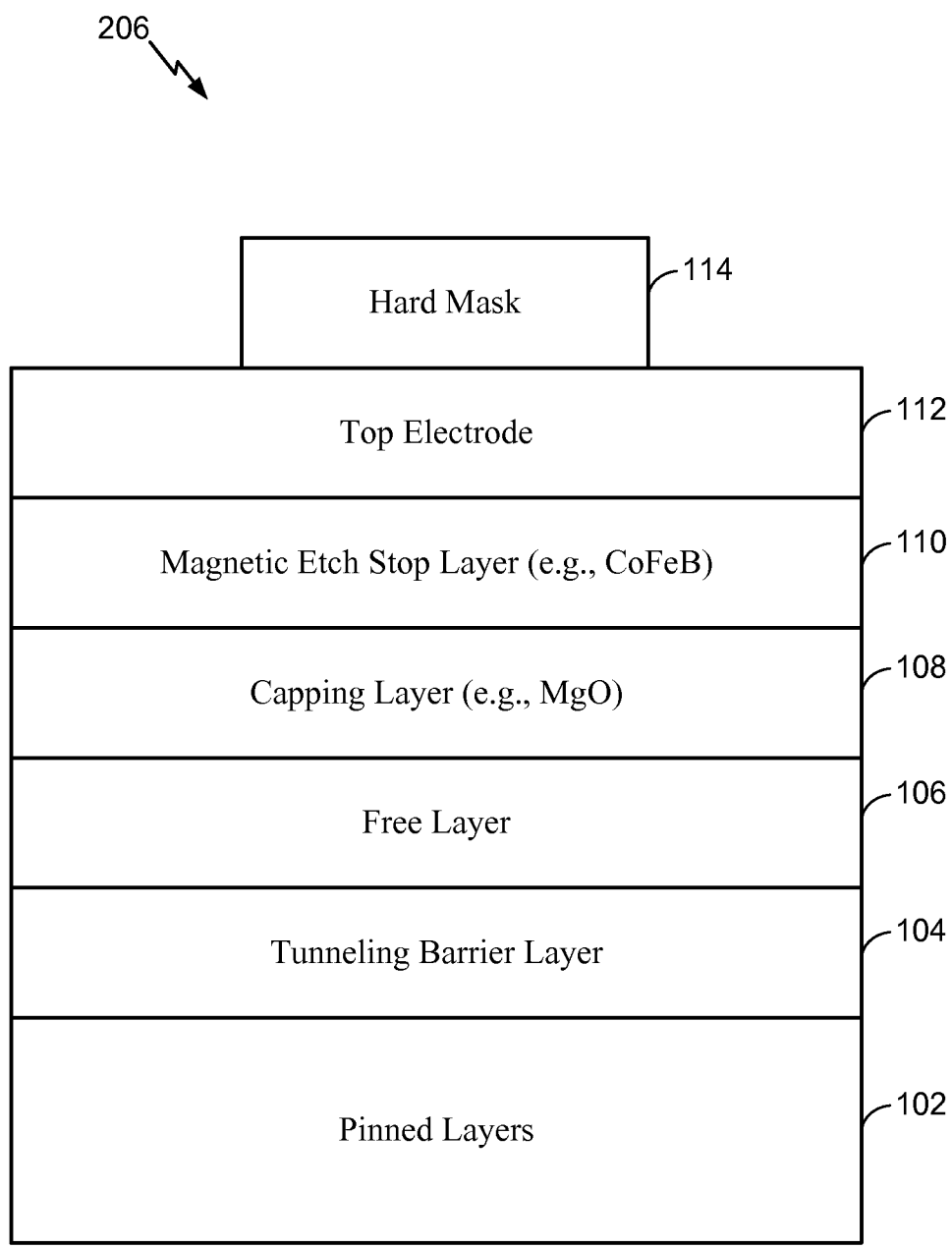
FIG. 2C is a diagram illustrating another particular stage of forming the STT-MRAM MTJ device of FIG. 1.

Referring to FIG. 2C, another particular stage 206 of forming the STT-MRAM MTJ device 100 of FIG. 1 is shown. According to the stage 206 of FIG. 2C, the layers 102-112 are patterned using lithography processes (e.g., electronic beam lithography and/or optical lithography). A hard mask 114 is also placed on the top electrode 112.

Figure 2D:
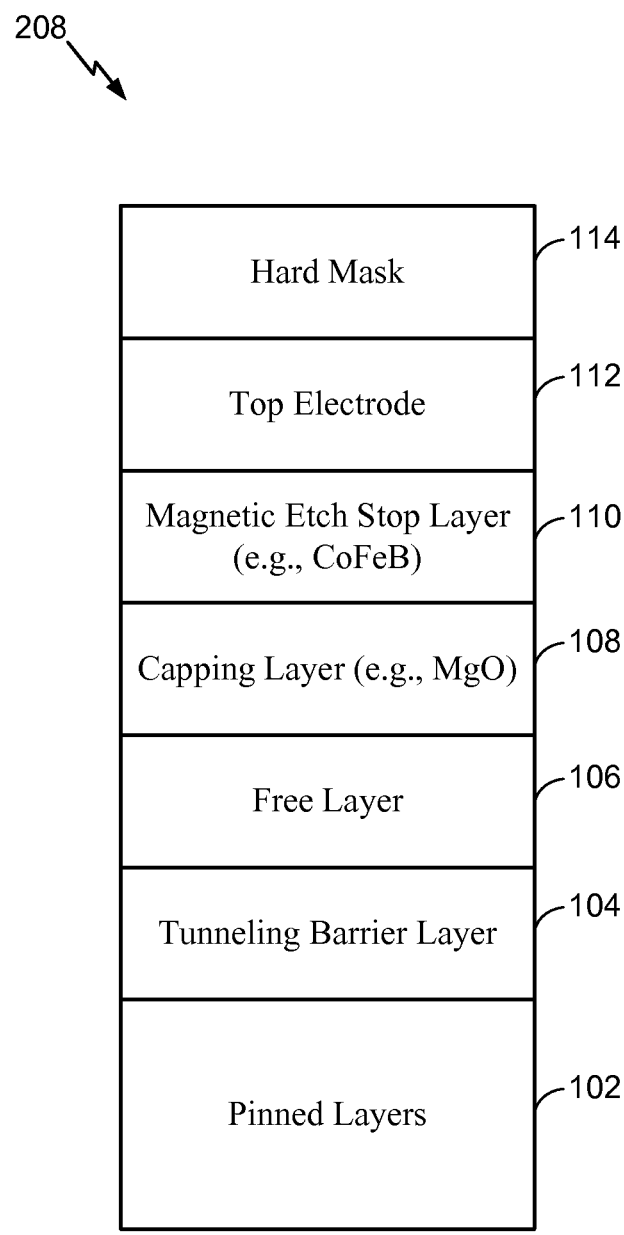
FIG. 2D is a diagram illustrating another particular stage of forming the STT-MRAM MTJ device of FIG. 1.

Referring to FIG. 2D, another particular stage 208 of forming the STT-MRAM MTJ device 100 of FIG. 1 is shown. According to the stage 208 of FIG. 2D, the layers 102-114 undergo a reactive ion etching (RIE) process. For example, the portions of the layers 102-114 that are not underneath the hard mask 114 are etched away during the RIE process such that the length of each layer 102-114 is etched to be approximately equal to the length of the hard mask 114. The magnetic etch stop layer 110 (in addition to the capping layer 108) may protect magnetic properties of the free layer 106 during the RIE process. For example, the magnetic etch stop layer 110 may stabilize the perpendicular magnetic anisotropy of the free layer 106, oxygen distribution, and inter-diffusion to withstand high annealing temperatures associated with the RIE process. After the RIE process is complete, the hard mask 114 may be removed to create the STT-MRAM MTJ device 100 of FIG. 1.

Figure 3:
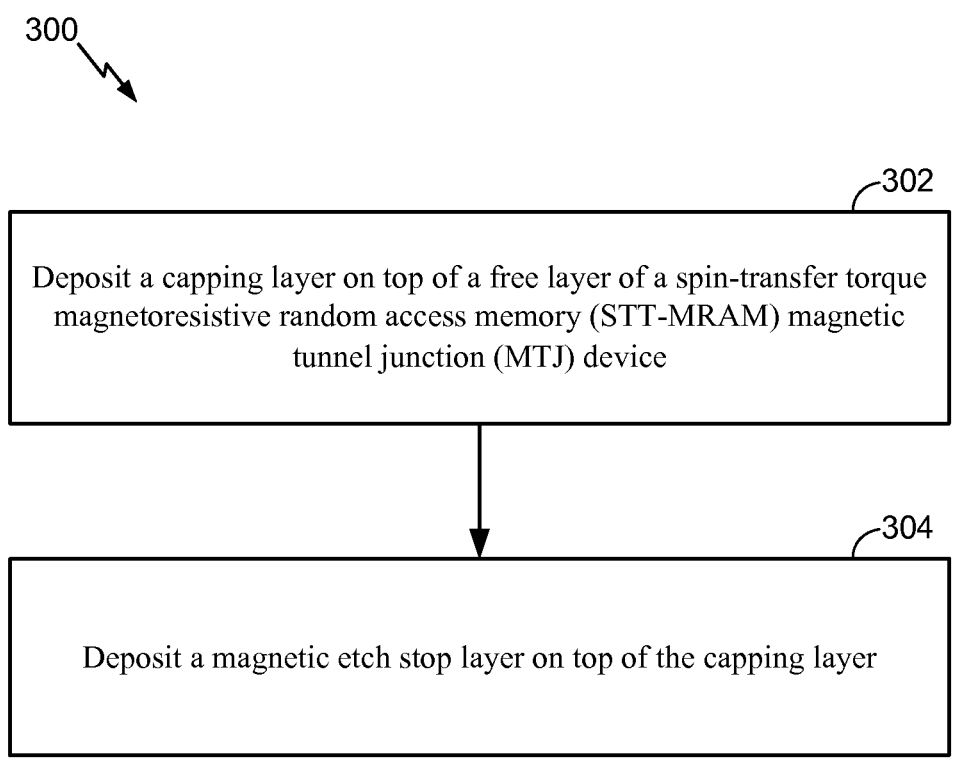
FIG. 3 depicts a flowchart to illustrate a particular embodiment of a method of forming a STT-MRAM MTJ device with a magnetic etch stop layer to reduce degradation of a free layer.

Referring to FIG. 3, a flowchart to illustrate a particular embodiment of a method 300 of forming a STT-MRAM MTJ device with a magnetic etch stop layer that is formed to reduce degradation of a free layer is shown. The method 300 may be performed by manufacturing equipment, as described with respect to FIG. 6. The method 300 may be used to fabricate the STT-MRAM MTJ device 100 of FIG. 1.

The method 300 may include depositing a capping layer on top of a free layer of the STT-MRAM MTJ device, at 302. For example, referring to FIG. 2A, the capping layer 108 (e.g., the Magnesium Oxide (MgO) capping layer) may be deposited on top of the free layer 106 in the chamber using PVD sputtering techniques.

A magnetic etch stop layer may be deposited on top of the capping layer, at 304. For example, referring to FIG. 2A, the magnetic etch stop layer 110 (e.g., the Cobalt Iron Boron magnetic etch stop layer) may be deposited on top of the capping layer 108 in the chamber using PVD sputtering techniques.

In a particular embodiment, the method 300 may also include depositing the top electrode 112 on top of the magnetic etch stop layer 110 in the chamber using the PVD sputtering techniques as illustrated in FIG. 2B. The method 300 may also include patterning the layers 102-112 using lithography processes and placing the hard mask 114 on the top electrode 114 as illustrated in FIG. 2C. The method 300 may also include performing the RIE process on the layers 102-114 as illustrated in FIG. 2D. For example, the portions of the layers 102-114 that are not underneath the hard mask 114 are etched away during the RIE process such that the length of each layer 102-114 is etched to be approximately equal to the length of the hard mask 114.

The method 300 of FIG. 3 may provide etch-stop protection to the free layer 106 during the RIE process. For example, the magnetic etch stop layer 110 may function as an etch-stop protection layer to the free layer 106 to stabilize the perpendicular magnetic anisotropy of the free layer 106 during high annealing temperatures associated with the etching process. To illustrate, the magnetic etch stop layer 110 may protect the magnetic properties of the free layer 106 during the etching process based on the chemical composition of the magnetic etch stop layer 110 and the capping layer 108 (e.g., a Cobalt Iron Boron (CoFeB) layer on top of a Magnesium Oxide (MgO) capping layer) when the magnetic etch stop layer 110 is approximately 5 Angstroms thick or less. The magnetic etch stop layer 110 may also reduce the switching current of the STT-MRAM MTJ device 100 without degrading TMR and/or the thermal barrier when the magnetic etch stop layer 110 has a thickness between 10 Angstroms and 30 Angstroms.

Referring to FIG. 4, a flowchart to illustrate another particular embodiment of a method 400 of forming a STT-MRAM MTJ device with a magnetic etch stop layer that is formed to reduce degradation of a free layer is shown. The method 400 may be performed by manufacturing equipment, as described with respect to FIG. 6. The method 300 may be used to fabricate the STT-MRAM MTJ device 100 of FIG. 1.

The method 400 may include depositing one or more pinned layers, a tunnel barrier layer, a free layer, and a capping layer into a chamber, at 402. For example, referring to FIG. 1, the pinned layers 102, the tunneling barrier layer 104, the free layer 106, and the capping layer 108 may be deposited into a chamber using PVD sputtering techniques.

A decision whether to improve (e.g., "optimize") perpendicular magnetic anisotropy or whether to reduce switching energy may be determined, at 404. In response to a decision to improve perpendicular magnetic anisotropy, a relatively thin magnetic etch stop layer may be deposited on top of the capping layer, at 406. For example, a thickness of the magnetic etch stop layer 110 may cause the magnetic etch stop layer 110 to be substantially magnetically inert. As a non-limiting illustrative example, the thickness of the magnetic etch stop layer 110 may be approximately 5 Angstroms or less such that the magnetic etch stop layer 110 is substantially magnetically inert. When the magnetic etch stop layer 110 is substantially magnetically inert, the magnetic contribution of the magnetic etch stop layer 110 to the STT-MRAM MTJ device 100 may be significantly reduced (or may be non-existent). For example, using a "thin" Cobalt Iron Boron (CoFeB) layer on top of a Magnesium Oxide (MgO) capping layer may enhance performance of the STT-MRAM MTJ device 100 by aiding in the formation of high perpendicular magnetic anisotropy in the free layer while protecting the free layer 106 during reactive ion etching (e.g., reducing atomic inter-diffusion processes).

In response to a decision to reduce switching energy, a relatively thick magnetic etch stop layer may be deposited on top of the capping layer, at 408. For example, the thickness of the magnetic etch stop layer 110 may cause the magnetic etch stop layer 110 to introduce in-plane anisotropy (e.g., exhibit magnetic moments) to the STT-MRAM MTJ device 100. As a non-limiting example, the thickness of the magnetic etch stop layer 110 may be between approximately 10 Angstroms and 30 Angstroms. The in-plane anisotropy (as opposed to a perpendicular anisotropy having a magnetic moment oriented out of the plane (e.g., vertically) of the STT-MRAM MTJ device 100) may reduce the switching current density (or energy) needed to operate the STT-MRAM MTJ device 100 without degrading tunnel magneto-resistance (TMR) and a thermal barrier of the STT-MRAM MTJ device 100. For example, the magnetic etch stop layer 110 may be "weakly" coupled to the free layer 106 by ferromagnetic coupling. The free layer 106 may have a perpendicular anisotropy (e.g., a magnetic moment oriented in a vertical direction) and the magnetic etch stop layer 110 may have the in-plane anisotropy (e.g., a magnetic moment oriented in a horizontal direction). Due to the in-plane anisotropy, spin polarized electrons may be more effective at inducing a torque of the free layer 106, which may reduce the amount of switching current needed to change the orientation of the magnetic moment in the free layer 106.

Etching and other processes may be performed, at 410. For example, the top electrode 112 may be deposited on top of the magnetic etch stop layer 110, the layers 102-112 may be patterned using lithography processes (e.g., electronic beam lithography and/or optical lithography), and the hard mask 114 may be placed on the top electrode 112. Additionally, the layers 102-114 may undergo a reactive ion etching (RIE) process. For example, the portions of the layers 102-114 that are not underneath the hard mask 114 may be etched away during the RIE process such that the length of each layer 102-114 is etched to be approximately equal to the length of the hard mask 114. The magnetic etch stop layer 110 (in addition to the capping layer 108) may protect magnetic properties of the free layer 106 during the RIE process. For example, the magnetic etch stop layer 110 may stabilize the perpendicular magnetic anisotropy of the free layer 106, oxygen distribution, and inter-diffusion to withstand high annealing temperatures associated with the RIE process. After the RIE process is complete, the hard mask 114 may be removed to create the STT-MRAM MTJ device 100 of FIG. 1.

The method 400 of FIG. 4 may provide etch-stop protection to the free layer 106 during the RIE process. For example, the magnetic etch stop layer 110 may function as an etch-stop protection layer to the free layer 106 to stabilize the perpendicular magnetic anisotropy of the free layer 106 during high annealing temperatures associated with the etching process. To illustrate, the magnetic etch stop layer 110 may protect the magnetic properties of the free layer 106 during the etching process based on the chemical composition of the magnetic etch stop layer 110 and the capping layer 108 (e.g., a Cobalt Iron Boron (CoFeB) layer on top of a Magnesium Oxide (MgO) capping layer) when the magnetic etch stop layer 110 is approximately 5 Angstroms thick or less. The magnetic etch stop layer 110 may also reduce the switching current of the STT-MRAM MTJ device 100 without degrading TMR and/or the thermal barrier when the magnetic etch stop layer 110 has a thickness between 10 Angstroms and 30 Angstroms.

Referring to FIG. 5, a block diagram of a particular illustrative embodiment of a wireless communication device is depicted and generally designated 500. The device 500 includes a processor 510 (e.g., a central processing unit (CPU) and a digital signal processor (DSP), etc.) coupled to a memory 532. The memory 532 may include instructions 560 executable by the processor 510.

The memory 532 may be a memory device, such as a random access memory (RAM), a magnetoresistive random access memory (MRAM), a STT-MRAM device (e.g., the STT-MRAM MTJ device 100 of FIG. 1), a flash memory, a read-only memory (ROM), a programmable read-only memory (PROM), an erasable programmable read-only memory (EPROM), an electrically erasable programmable read-only memory (EEPROM), registers, a hard disk, a removable disk, or a compact disc read-only memory (CD-ROM). A memory device 580 may also be coupled to the processor 510. The memory device 580 may include one or more STT-MRAM MTJ devices. For example, the memory device 580 may include the STT-MRAM MTJ device 100 of FIG. 1.

FIG. 5 also shows a display controller 526 that is coupled to the processor 510 and to a display 528. An encoder/decoder (CODEC) 534 may be coupled to the processor 510, as shown. A speaker 536 and a microphone 538 can be coupled to the CODEC 534. FIG. 5 also shows a wireless controller 540 coupled to the processor 510 and to an antenna 542. In a particular embodiment, the processor 510, the display controller 526, the memory 532, the CODEC 534, and the wireless controller 540 are included in a system-in-package or system-on-chip device (e.g., a mobile station modem (MSM)) 522. In a particular embodiment, an input device 530, such as a touchscreen and/or keypad, and a power supply 544 are coupled to the system-on-chip device 522. Moreover, in a particular embodiment, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

In conjunction with the described embodiments, an apparatus includes first means for protecting a free layer disposed on top of the free layer. For example, the first means for protecting may include the capping layer 108 of FIG. 1 (e.g., a Magnesium Oxide (MgO) capping layer), one or more other capping layers, or any combination thereof. During an etching process, the capping layer 108 may protect magnetic properties of the free layer 106 of FIG. 1. For example, the capping layer 108 may stabilize the perpendicular magnetic anisotropy of the free layer 106 during high annealing temperatures associated with the etching process (e.g., a reactive ion etching process).

The apparatus may also include second means for protecting the free layer. The second means is disposed on top of the first means. For example, the second means for protecting may include the magnetic etch stop layer 110 of FIG. 1 (e.g., the Cobalt Iron Boron (CoFeB) magnetic etch stop layer), one or more other magnetic etch stop layers, or any combination thereof. The first means for protecting and the second means for protecting may be included in a STT-MRAM MTJ device. During an etching process, the magnetic etch stop layer 110 may protect magnetic properties of the free layer 106 of FIG. 1. For example, the magnetic etch stop layer 110 may stabilize the perpendicular magnetic anisotropy of the free layer 106 during high annealing temperatures associated with the etching process (e.g., a reactive ion etching process).

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices, such as a communications device (e.g., a mobile phone), a tablet, a laptop, a personal digital assistant (PDA), a set top box, a music player, a video player, an entertainment unit, a navigation device, a fixed location data unit, or a computer. FIG. 6 depicts a particular illustrative embodiment of an electronic device manufacturing process 600.

Physical device information 602 is received at the manufacturing process 600, such as at a research computer 606. The physical device information 602 may include design information representing at least one physical property of a semiconductor device, such as the STT-MRAM MTJ device 100 of FIG. 1. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular embodiment, the library file 612 includes at least one data file including the transformed design information. For example, the library file 612 may include a library of semiconductor devices including the STT-MRAM MTJ device 100 of FIG. 1, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a device, such as the STT-MRAM MTJ device 100 of FIG. 1, of the library file 612. For example, a user of the design computer 614 may enter circuit design information 622 via a user interface 624 coupled to the design computer 614. The circuit design information 622 may include design information representing at least one physical property of a semiconductor device, such as the STT-MRAM MTJ device 100 of FIG. 1. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing a device, such as the STT-MRAM MTJ device 100 of FIG. 1. To illustrate, the data file may include information corresponding to a system-on-chip (SOC) that includes the STT-MRAM MTJ device 100 of FIG. 1, and that also includes additional electronic circuits and components within the SOC.

The GDSII file 626 may be received at a fabrication process 628 to manufacture a semiconductor device, such as the STT-MRAM MTJ device 100 of FIG. 1, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including the STT-MRAM MTJ device 100 of FIG. 1.

In a particular embodiment, the fabrication process 628 may be initiated by or controlled by a processor 634. The processor 634 may access a memory 635 that includes executable instructions 637, such as computer-readable instructions or processor-readable instructions. The executable instructions may include one or more instructions that are executable by a computer, such as the processor 634. The fabrication process 628 may be implemented by a fabrication system that is fully automated or partially automated. For example, the fabrication process 628 may be automated and may perform processing steps according to a schedule. The fabrication system may include fabrication equipment (e.g., processing tools) to perform one or more operations to form an electronic device.

The fabrication system may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls and/or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 634.

Alternatively, the processor 634 may be a part of a high-level system, subsystem, or component of the fabrication system. In another embodiment, the processor 634 includes distributed processing at various levels and components of a fabrication system.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including a device, such as the STT-MRAM MTJ device 100 of FIG. 1.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the STT-MRAM MTJ device 100 of FIG. 1. In other embodiments, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a communications device (e.g., a mobile phone), a tablet, a laptop, a personal digital assistant (PDA), a set top box, a music player, a video player, an entertainment unit, a navigation device, a fixed location data unit, and a computer, into which the STT-MRAM MTJ device 100 of FIG. 1 is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrated circuitry including memory and on-chip circuitry.

A device, such as the STT-MRAM MTJ device 100 of FIG. 1, may be fabricated, processed, and incorporated into an electronic device, as described in the illustrative process 600. For example, the STT-MRAM MTJ device 100 of FIG. 1 may be integrated into a die in an electronic device. The electronic device may include a communications device, a tablet, a laptop, a set top box, a music player, a video player, an entertainment unit, a navigation device, a personal digital assistant (PDA), a fixed location data unit, or a computer. One or more aspects of the embodiments disclosed with respect to FIGS. 1-4 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical embodiments such as the mask 632, the die 636, the package 640, the PCA 658, other products such as prototype circuits or devices (not shown), or any combination thereof. Although various representative stages of production from a physical device design to a final product are depicted, in other embodiments fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
a capping layer disposed on top of a free layer;
a magnetic layer disposed on top of the capping layer; and
an electrode layer disposed between the magnetic layer and a hard mask layer, wherein the capping layer and the magnetic layer are included in a spin-transfer torque magnetoresistive random access memory (STT-MRAM) magnetic tunnel junction (MTJ) device.

2. The apparatus of claim 1, wherein the capping layer is comprised of Magnesium Oxide, Aluminum Oxide, Hafnium Oxide, or Tantalum Oxide.

3. The apparatus of claim 1, wherein the magnetic layer is comprised of Cobalt Iron Boron, Cobalt Iron, Iron Boron, Nickel Iron Boron, Nickel Iron Silicon Boron, or Nickel Iron.

4. The apparatus of claim 1, wherein a thickness of the magnetic layer causes the magnetic etch stop layer to be substantially magnetically inert.

5. The apparatus of claim 4, wherein the thickness of the magnetic layer is less than 5 Angstroms.

6. The apparatus of claim 4, wherein the thickness of the magnetic layer is approximately 5 Angstroms.

7. The apparatus of claim 1, wherein the STT-MRAIVI MTJ device is a perpendicular MTJ device.

8. The apparatus of claim 7, wherein a thickness of the magnetic layer causes the magnetic layer to introduce in-plane anisotropy to the STT-MRAM MTJ device.

9. The apparatus of claim 8, wherein the thickness of the magnetic layer is between approximately 10 Angstroms and 30 Angstroms.

10. An apparatus comprising:
first means for protecting a free layer disposed on top of the free layer;
second means for protecting the free layer, the second means disposed on top of the first means for protecting, wherein the second means comprises a magnetic material; and
means for conducting disposed between the second means and means for masking, wherein the first means and the second means are included in a spin-transfer torque magnetoresistive random access memory (STT-MRAM) magnetic tunnel junction (MTJ) device.

11. The apparatus of claim 10, wherein the first means for protecting is comprised of Magnesium Oxide, Aluminum Oxide, Hafnium Oxide, or Tantalum Oxide.

12. The apparatus of claim 10, wherein the second means for protecting is comprised of Cobalt Iron Boron, Cobalt Iron, Iron Boron, Nickel Iron Boron, Nickel Iron Silicon Boron, or Nickel Iron.

13. The apparatus of claim 10, wherein a thickness of the second means for protecting causes the second means for protecting to be substantially magnetically inert.

14. The apparatus of claim 13, wherein the thickness of the second means for protecting is less than 5 Angstroms.

15. The apparatus of claim 13, wherein the thickness of the second means for protecting is approximately 5 Angstroms.

16. The apparatus of claim 10, wherein the STT-MRAIVI MTJ device is a perpendicular MTJ device.

17. The apparatus of claim 16, wherein a thickness of the second means for protecting causes the second means for protecting to introduce in-plane anisotropy to the STT-MRAM MTJ device.

18. The apparatus of claim 17, wherein the thickness of the second means for protecting is greater than approximately 10 Angstroms.

19. A perpendicular spin-transfer torque magnetoresistive random access memory (STT-MRAM) magnetic tunnel junction (MTJ) device comprising:
a Magnesium Oxide (MgO) capping layer disposed on top of a free layer; and
a 5-Angstrom thick Cobalt Iron Boron (CoFeB) magnetic layer disposed on top of the MgO capping layer; and
an electrode layer disposed between the 5-Angstrom thick Cobalt Iron Boron (CoFeB) magnetic layer and a hard mask layer.

20. The perpendicular STT-MRAM MTJ device of claim 19, wherein the 5-Angstrom thick CoFeB magnetic layer is substantially magnetically inert.

21. The apparatus of claim 1, wherein the capping layer is comprised of Magnesium Oxide.

22. The apparatus of claim 1, wherein the capping layer is comprised of Aluminum Oxide.

23. The apparatus of claim 1, wherein the capping layer is comprised of Hafnium Oxide.

24. The apparatus of claim 1, wherein the capping layer is comprised of Tantalum Oxide.

25. The apparatus of claim 1, wherein the magnetic layer is comprised of Cobalt Iron Boron.

26. The apparatus of claim 1, wherein the magnetic layer is comprised of Cobalt Iron.

27. The apparatus of claim 1, wherein the magnetic layer is comprised of Iron Boron.

28. The apparatus of claim 1, wherein the magnetic layer is comprised of Nickel Iron Boron.

29. The apparatus of claim 1, wherein the magnetic layer is comprised of Nickel Iron Silicon Boron.

30. The apparatus of claim 1, wherein the magnetic layer is comprised of Nickel Iron.

* * * * *